United States Patent [19]
Kirsch et al.

[11] Patent Number: 5,786,709
[45] Date of Patent: Jul. 28, 1998

[54] INTEGRATED CIRCUIT OUTPUT DRIVER INCORPORATING POWER DISTRIBUTION NOISE SUPPRESSION CIRCUITRY

[75] Inventors: Howard C. Kirsch, Taoyuan; Yen-Tai Lin, Hsinchu; Chiun-chi Shen, Hsinchu; Jiang-Hong Ho, Kaohsung; Jack-Lian Kuo, Tainan, all of Taiwan

[73] Assignee: Vanguard International Semiconductor Corporation

[21] Appl. No.: 738,214

[22] Filed: Oct. 25, 1996

[51] Int. Cl.$^6$ ................................. H03K 19/0948
[52] U.S. Cl. ................................. 326/27; 326/83
[58] Field of Search ................ 326/26–27, 82–83, 326/86

[56] References Cited

U.S. PATENT DOCUMENTS

| | | | |
|---|---|---|---|
| 5,315,187 | 5/1994 | Chen | 307/542.1 |
| 5,652,527 | 7/1997 | Phillips et al. | 326/27 X |
| 5,672,983 | 9/1997 | Yamamoto et al. | 326/27 |

Primary Examiner—Jon Santamauro
Attorney, Agent, or Firm—George O. Saile; Stephen B. Ackerman; Bill Knowles

[57] ABSTRACT

A circuit for the control of a power or ground distribution transient voltage or power bounce or ground bounce is described. The circuit has a driver transistor of a first conductivity type and a driver transistor of a second conductivity type connected so as to be able to transfer a voltage to a data output terminal from a I/O voltage distribution network or a I/O ground distribution network. As the output terminal changes from a logic 1 to a logic 0 the driver transistor of the first conductivity type will conduct and a ground distribution voltage transient will begin to appear. A suppression transistor of the first conductivity type that will begin to conduct to begin cessation of conduction of the driver transistor of the first conductivity type decreasing the slew rate of the driver transistor of the first conductivity type. As the output terminal changes from a logic 0 to a logic 1 the driver transistor of the second conductivity type will conduct and a power distribution voltage transient will begin to appear. A suppression transistor of the second conductivity type that will begin to conduct to begin cessation of conduction of the driver transistor of the second conductivity type decreasing the slew rate of the driver transistor of the second conductivity type. The transistors may be PMOS, NMOS, NPN bipolar, or PNP bipolar integrated upon a silicon or compound semiconductor substrate.

12 Claims, 5 Drawing Sheets

FIG. 1a – Prior Art

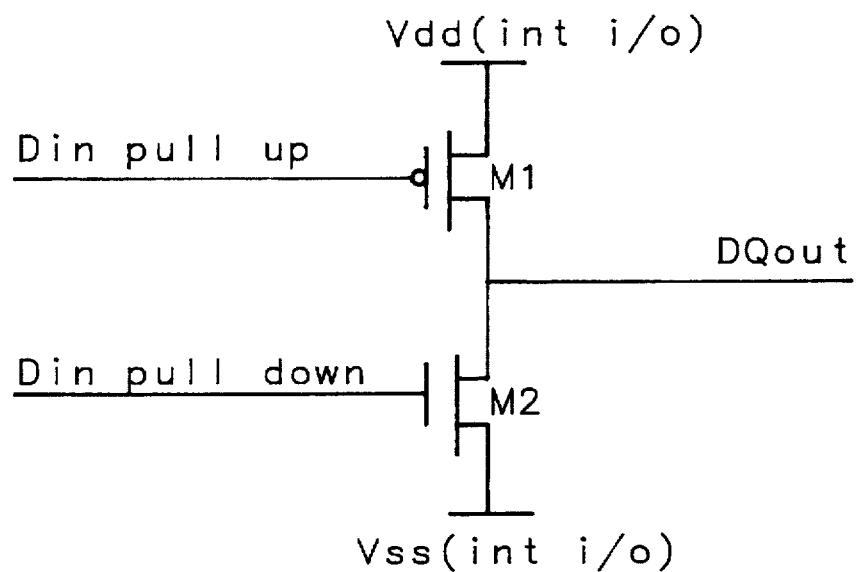
FIG. 1b - Prior Art
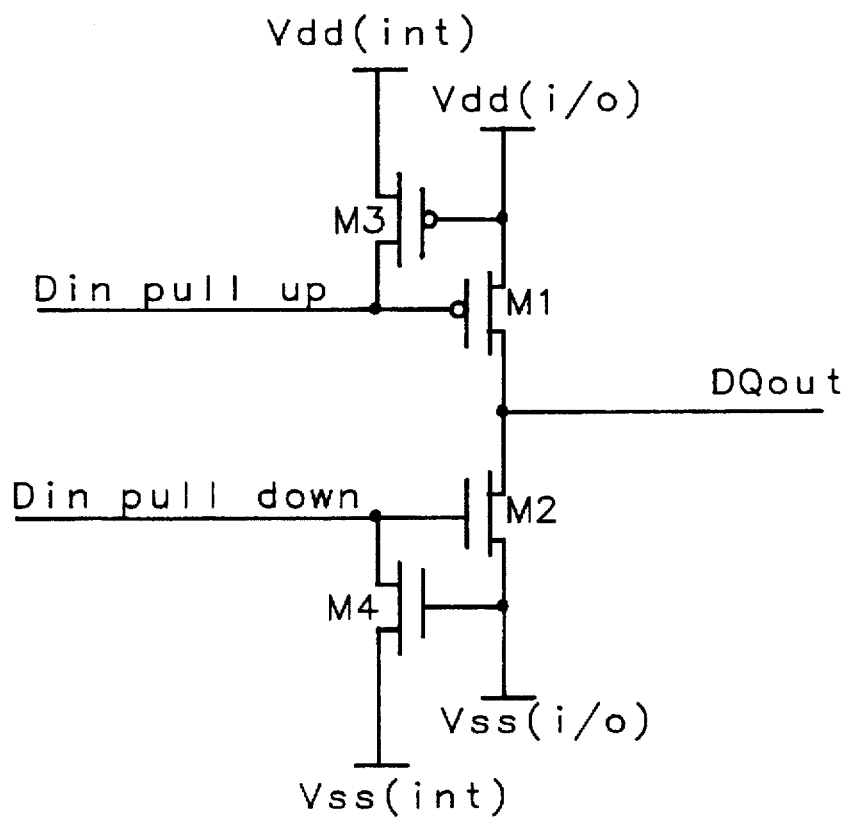
FIG. 2

INTEGRATED CIRCUIT OUTPUT DRIVER INCORPORATING POWER DISTRIBUTION NOISE SUPPRESSION CIRCUITRY

BACKGROUND OF THE INVENTION

1. Field of the Invention

This invention relates to circuits that transfer digital data from one integrated circuit device to other integrated circuit devices and more particularly to circuits that incorporate means of suppression of transient voltages created on the power distribution network incorporated and attached to said integrated circuit through the simultaneous activation of a plurality of said circuits.

2. Description of Related Art

The power bounce and ground bounce phenomena are transient voltages that result from the switching of multiple output drivers on an integrated circuit chip from a logic 1 to a logic 0 or from a logic 0 to a logic 1 simultaneously. If the transient voltages are sufficiently large, they may cause errors or delay in the transfer of the digital data from one integrated circuit to other integrated circuits. Additionally these large transient voltages may also cause misoperation of the internal circuits of the integrated circuits chip.

FIG. 1a depicts schematically a typical configuration of a first integrated circuit chip chip1 configured to transfer digital data to a second integrated circuit chip chip2. The first integrated circuit chip chip1 has a plurality of logic circuits that form the internal logic. Coupled to the internal logic is a data bus Din that is a plurality of connections to that transfer the digital data to the multiple output driver circuits D.

The internal logic has internal voltage terminal Vdd(int) that is coupled through the power distribution network $X_2$ to the voltage source Vdd. The power distribution network $X_2$ is modeled by a parasitic inductance $L_p$, a parasitic resistance $R_p$, and the parasitic capacitors $C_1$ and $C_2$. These parasitic components simulate the distributed inductances, resistances, and capacitances of the physical wiring and connection interfaces of the integrated circuit chip chip1, the module onto which the integrated circuit chip is joined, the printed circuit card onto which the module placed, and the cabling and connectors that physically connect the voltage source Vdd to the internal logic.

The internal logic has a internal reference terminal Vss (int) that is coupled through the internal ground reference distribution network $X_3$ to a system ground reference point GND. The internal ground distribution network $X_3$ represents the parasitic components that simulate the distributed inductances, resistances, and capacitances of the physical wiring and connections as described above for the internal voltage distribution network $X_2$.

The multiple output driver circuits D are connected to the input/output internal voltage terminal Vdd(i/o). The input/output internal voltage terminal Vdd(i/o) is connected through the input/output power distribution network $X_1$ to the voltage source Vdd. The input/output power distribution network $X_1$ comprises the set of parasitic components that simulate the distributed inductances, resistances, and capacitances of the physical wiring and connections as described above for the internal voltage distribution network $X_2$.

The multiple output driver circuits D are connected to an input/output ground reference terminal Vss(i/o). The input/output ground reference terminal Vss(i/o) is connected through the input/output ground reference distribution network $X_4$ to the ground reference point GND. The input/output ground reference distribution network $X_4$ comprises the set of parasitic components that simulate the distributed inductances, resistances, and capacitances of the physical wiring and connections as described above for the internal voltage distribution network $X_2$.

The output of each of the driver circuit D is connected through the wiring network $X_5$ to the receivers of the second integrated circuit chip chip2. The wiring network is a model of the distributed inductances, resistances, and capacitances of the physical wiring and connection interfaces similar to those described above for the internal power distribution network $X_2$.

Each receiver R has a load capacitance $C_L$ associated with it that must be charged from a low voltage level that represents the logic 0 to a higher voltage level that represents a logic 1, or discharged from said higher voltage level to said low voltage level to transfer the digital data from the first integrated circuit chip chip1 to the second integrated circuit chip chip2. The current necessary to charge the load capacitance $C_L$ from a logic 0 to a logic 1 is provided through the wiring network $X_5$, the driver D, and the input/output voltage distribution network $X_1$ from the voltage source Vdd. The current formed as the capacitor $C_L$ is discharged to a logic 0 flows through wiring network $X_5$, the driver D, and the input/output ground distribution network $X_4$ from the ground reference point GND.

The instantaneous currents to charge or discharge the capacitor $C_L$ are time variant currents and have the function $$i_i = C_L \frac{dV_i}{dt}$$

where $dV_i$=the change in voltage from a voltage from a logic 1 to a logic 0 or from a logic 0 to logic 1.

dt=the time for the change in the voltage.

The value of $dV_i/dt$ is referred to as the slew rate for the driver D and is expressed in units of volts per second.

As the current to charge or discharge the capacitor $C_L$ flows through the parasitic inductor of the input/output voltage distribution network or the input/output ground reference distribution network, a voltage $V_i$ will be induced across the inductance in series with the input/output voltage terminal Vdd(i/o) or the input/output ground reference terminal Vss(i/o). This voltage $V_i$ is:

$$V_i = L \frac{di}{dt}$$

where di/dt=the time rate of change of the current to charge and discharge the load capacitances $C_L$.

The parasitic inductors of the input/output voltage distribution network $X_1$ and of the input/output ground reference distribution network $X_4$ are in the charge and discharge path for all of the multiple output driver circuits D on the first integrated circuit chip chip1. If many of the multiple output driver circuit D switch from a logic 0 to a logic 1, the current for all of those of the multiple output drivers D will flow through the parasitic inductor of the input/output power distribution network $X_1$ and the voltage induced by this current will be a multiple of the number of driver circuits D being switched. This induced voltage is superimposed upon the DC voltage at the input/output voltage terminal Vdd(i/o) and will cause corruption of the digital data being transferred.

A similar voltage will be induced by the parasitic inductor of the input/output ground reference distribution network at the input/output ground reference terminal Vss(i/o), whenever many of the multiple output driver circuits D switch from a logic 1 to a logic 0. This voltage will be superimposed upon the input/output ground reference voltage Vss (i/o) and will also cause corruption of digital data being transferred.

These induced power and ground voltages are termed power bounce and ground bounce and are of particular concern for the design of the output buffer circuit on integrated circuit designs such as dynamic random access memories, static random access memories, and application specific integrated circuit chips.

FIG. 1b shows a typical output buffer circuit as implemented within the output driver circuit D of FIG. 1a. A P-type metal oxide semiconductor transistor (PMOST) M1 has a gate connected to a data input terminal Din pull up. The source of the PMOST M1 is connected to the input/output voltage terminal Vdd(i/o) and the drain is connected to the data output terminal DQout. The data output terminal DQout is connected to the wiring distribution network $X_5$ of FIG. 1a.

A first N-type metal oxide semiconductor transistor (NMOST) M2 has a gate connected to a data input terminal Din pull down. The source of the NMOST M2 is connected to the input/output ground reference terminals Vss(i/o) and the drain is connected to the data output terminal DQout.

The data input terminals Din pull up and Din pull down are connected to the internal logic of FIG. 1a. If the data output terminal DQout is at a logic 1 and the load capacitor $C_L$ of FIG. 1a has been charged to the voltage level of a logic 1 and the input terminals Din pull up and Din pull down are brought from a logic 0 to a logic 1, the PMOST M1 will stop conducting and the NMOST M2 will begin to conduct allowing the load capacitor $C_L$ of FIG. 1a to start to discharge. This current will cause the induction of the aforementioned transient voltage at the input/output ground reference terminal Vss(i/o). However, if the output terminal DQout is at a logic 0, the load capacitor $C_L$ of FIG. 1a is fully discharged to logic 0, and the input terminals Din pull up and Din pull down are brought from a logic 1 to a logic 0 the NMOST $M_2$ will stop conducting and the PMOST $M_1$ will begin to conduct allowing the load capacitor $C_L$ to start to charge. The charging current will cause the aforementioned transient voltage at the input/output voltage terminal Vdd(i/o).

U. S. Pat. 5,315,187 (Cheng) discloses a modification to an output buffer that will control the aforementioned ground and power bounce.

SUMMARY OF THE INVENTION

An object of this invention is the minimization or control of an induced noise voltage or power and ground bounce upon voltage and ground distribution networks on integrated circuits due to switching of output buffer circuits. Since $$\frac{di}{dt} = \frac{V}{L}$$

for an inductor, a non-zero induced noise voltage is required in order for any current to flow, however, this voltage needs to be controlled.

To accomplish this object, the off chip driving circuit of this invention has a driver transistor of a first conductivity type with a first terminal coupled to a data input pull down terminal, a second terminal coupled to a input/output ground reference terminal and third terminal coupled to a data output terminal. The off chip driver circuit additionally has a driver transistor of a second conductivity type with a first terminal coupled to a data input pull up terminal, a second terminal coupled to a input/output voltage terminal, and a third terminal coupled to the output terminal. The off chip driving circuit further has a suppression transistor of the first conductivity type and a suppression transistor of the second conductivity type. The suppression transistor of the first conductivity type has a first terminal coupled to the input/output ground reference terminal, a second terminal coupled to the internal ground reference terminal, and a third terminal coupled to the first terminal of the driver transistor of the first conductivity type. The suppression transistor of the second conductivity type has a first terminal coupled to the input/output voltage terminal, a second terminal coupled to the internal voltage reference terminal, and a third terminal coupled to the first terminal of the driver transistor of the second conductivity type.

When the output terminal is brought from a logic 1 to a logic 0, the driver transistor of the first conductivity type is conducting a current to cause the induced noise voltage to be created upon the ground reference terminal. When the induced noise voltage reaches the threshold voltage of the suppression transistor of the first conductivity type, the suppression transistor of the first conductivity type will begin to conduct and to cause the driver transistor of the first conductivity type to begin to cease to conduct thus decreasing the current and controlling the induced noise voltage. Conversely, when the output terminal is brought from a logic 0 to logic 1, the driver transistor of the second conductivity type is conducting a current to cause the induced noise voltage to be created upon the input/output voltage terminal. The induced noise voltage causes the suppression transistor of the second conductivity type to begin to conduct and to cause the driver transistor of the second conductivity type to begin to cease conduction, and controlling the induced voltage.

The transistors may be MOST, or bipolar transistors and the first and second conductivity types may be either P-type or N-type material. The transistors may be integrated upon a silicon substrate or a compound semiconductor substrate such as Gallium Arsinide (GaAs).

BRIEF DESCRIPTION OF THE DRAWINGS

FIG. 2 is a schematic drawing of an off chip driving circuit incorporating a first embodiment of the power bounce suppression circuit of this invention implemented as MOST.

DETAILED DESCRIPTION OF THE INVENTION

A first embodiment of this invention is illustrated in FIG. 2. The driver PMOST $M_1$ and the driver NMOST $M_2$ are connected and function as described in FIGS. 1a and 1b. A suppression PMOST $M_3$ has a gate connected to the input/output voltage terminal Vdd(i/o). The input/output voltage terminal Vdd(i/o) is connected as described in FIG. 1a. The source of the suppression PMOST $M_3$ is connected to the internal voltage terminal Vdd(int) and the drain of the suppression PMOST $M_3$ is connected to the gate of the driver PMOST $M_1$. The internal voltage terminal Vdd(int) is connected and functions as described in FIG. 1a.

Figure 1:
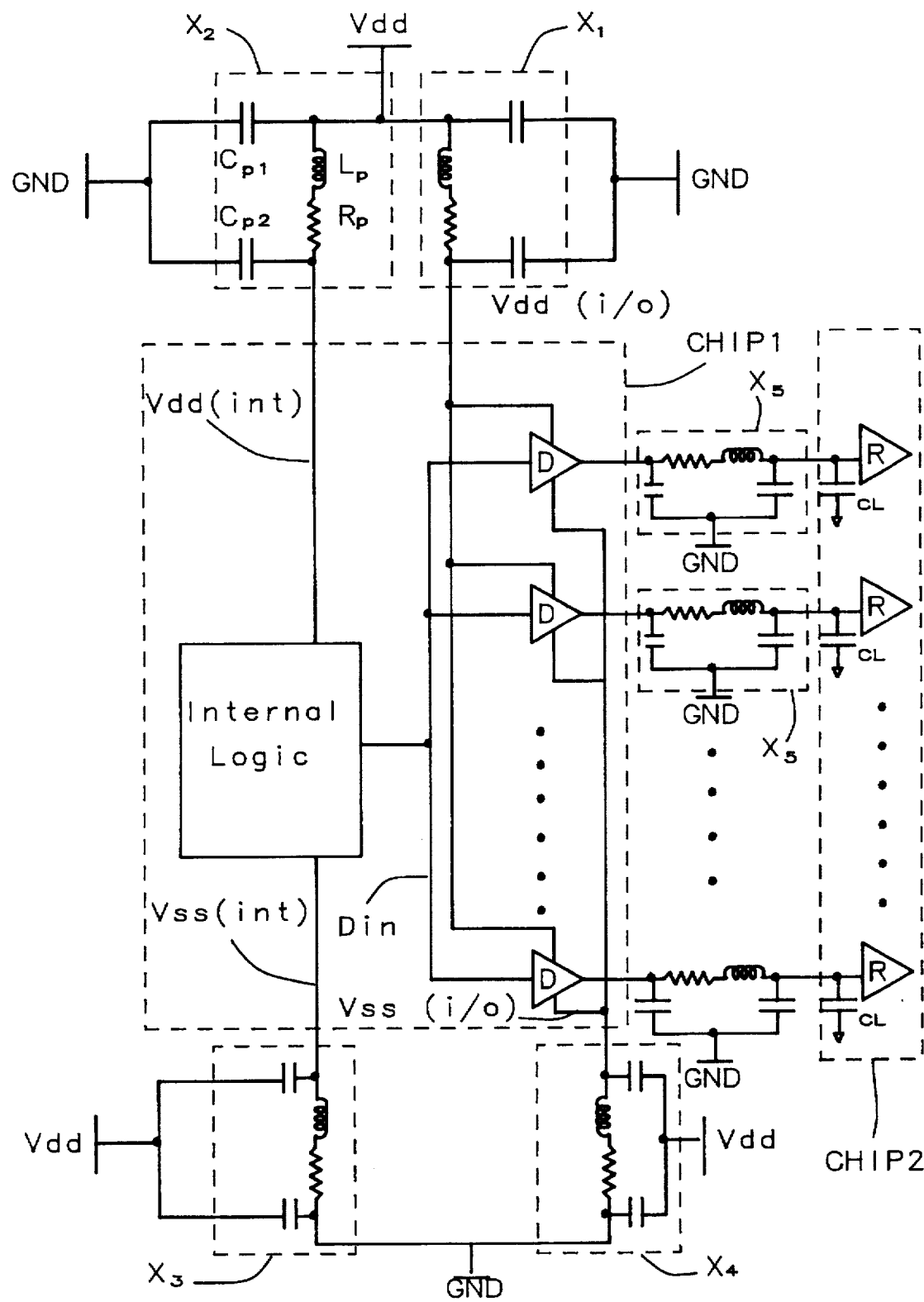
FIG. 1a is a schematic diagram of an integrated circuit device with plurality of off chip driving circuits coupled to wiring networks and power supply and ground distribution networks of conventional art.
FIG. 1b is a schematic diagram of an off chip driving circuit of conventional art.

A suppression NMOST $M_4$ has a gate connected to the input/output ground reference terminal Vss(i/o) which is connected and functions as in FIG. 1a. The source of the NMOST $M_4$ is connected to the internal logic ground reference terminal Vss(int) and the drain is connected to the gate of the driver NMOST $M_2$. The internal logic ground reference terminal Vss(int) is connected and functions as described in FIG. 1a.

If the data output terminal DQout is a logic 1 and the data inputs Din pull up and Din pull down are brought from a logic 0 to a logic 1, the driver PMOST $M_1$ and driver NMOST $M_2$ start of operate as described in FIG. 1b. However, as the induced voltage at the input/output ground reference terminal Vss(i/o) starts to increase such that this voltage is greater than the voltage at the internal ground reference terminal Vss(int), the suppression NMOST $M_4$ starts to conduct. This lowers the voltage at the gate of the driver NMOST $M_2$ thus starting to turn off the conduction of driver NMOST $M_2$. The lack of current through the input/output ground reference voltage network $X_4$ of FIG. 1a eliminates the induced voltage at the input/output ground reference terminal Vss(i/o).

Conversely, if the data output terminal DQout is at a logic 0 and the data inputs Din pull up and Din pull down are brought from a logic 1 to a logic 0, the driver PMOST $M_1$ and driver NMOST $M_2$ start of operate as described in FIG. 1b. The suppression PMOST $M_3$ starts to operate as described above for suppression NMOST $M_4$. The induced voltage at the input/output voltage terminal Vdd(i/o) is now suppressed.

Figure 3A:
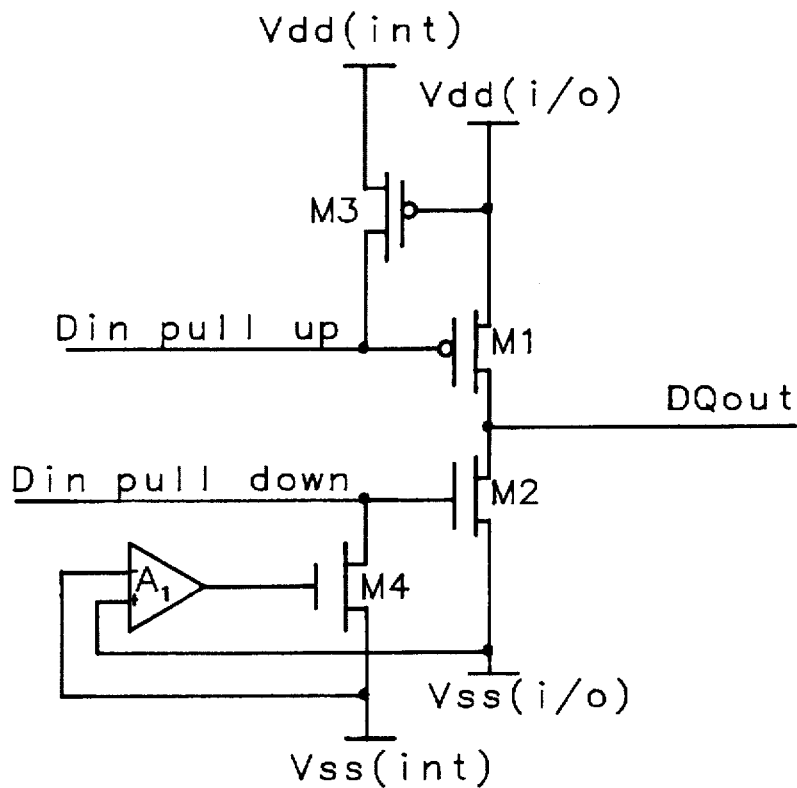
FIGS. 3a and 3b are schematic drawings of an off chip driving circuit incorporating a second embodiment of the power bounce suppression circuit of this invention.

FIG. 3a illustrates a second embodiment of this invention. The driver PMOST $M_1$, the driver NMOST $M_2$, and the suppression PMOST $M_3$ are as described above for FIG. 2. The gate of the suppression NMOST $M_4$ is now connected to the output of the amplifier $A_1$. The positive input of the amplifier $A_1$ is connected to the input/output ground reference terminal Vss(i/o), and the negative input of the amplifier $A_1$ is connected to the internal ground reference terminal Vss(int). Any induced noise present at the input/output ground reference terminal Vss(i/o) will now appear as a difference in the voltage at the input/output ground reference terminal Vss(i/o) and the internal ground reference terminal Vss(int) and will be amplified by amplifier $A_1$. The suppression NMOST $M_4$ will begin to conduct at a lower induced voltage. This will increase the sensitivity of the control of the slew rate of the driver NMOST $M_2$.

Figure 3B:
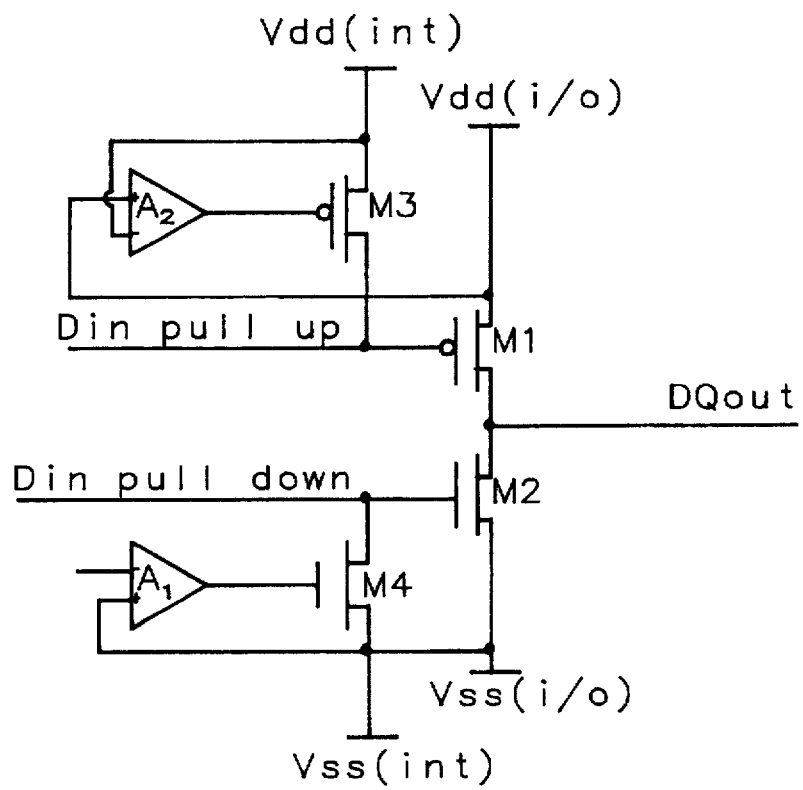

FIG. 3b illustrates the second embodiment wherein the PMOST's $M_1$ and $M_3$ are now configured as the NMOST's $M_2$ and $M_4$ of FIG. 3a. The gate of the PMOST $M_3$ is connected to the output of the second amplifier $A_2$. The positive input of the second amplifier $A_2$ is connected to the input/output voltage terminal Vdd(i/o) and the negative input of the second amplifier $A_2$ is connected to the to internal voltage terminal Vdd(int). As in FIG. 3a any induced noise will appear as a difference in voltage between the input/output voltage terminal Vdd(i/o) and the internal voltage terminal Vdd(int). This voltage difference will be amplified by the second amplifier $A_2$ and the suppression PMOST $M_3$ will begin to conduct at a smaller induced voltage, thus increasing the sensitivity of the control of the slew rate of the driver PMOST $M_1$.

Figure 4A:
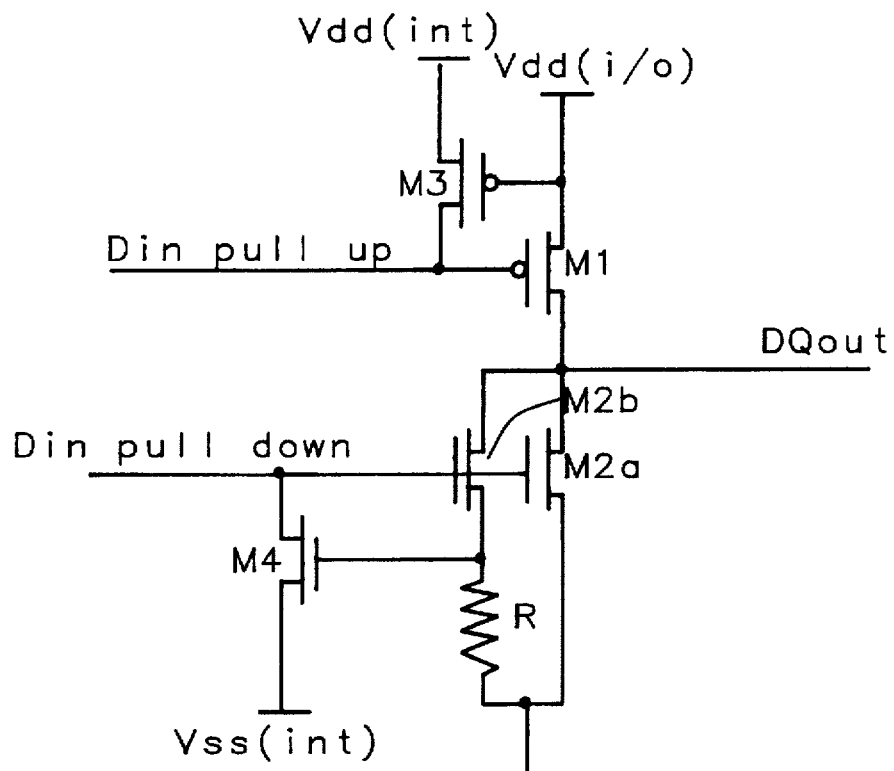
FIGS. 4a and 4b are schematic drawings of an off chip driving circuit incorporating a third embodiment of the power bounce suppression circuit of this invention.

A third embodiment of the present invention is shown in FIG. 4a. The PMOST's $M_1$ and $M_3$ are as described in FIG. 2. The NMOST $M_2$ of FIG. 2 is partitioned into two separate NMOST's $M_{2a}$ and $M_{2b}$. The size of NMOST $M_{2a}$ is approximately 90% the size of the NMOST $M_2$ of FIG. 2 and the NMOST $M_{2b}$ is approximately 10% of the NMOST $M_2$ of FIG. 2. The NMOST $M_2a$ is connected and operates as the NMOST $M_2$ of FIG. 2 as described above.

The gate of the NMOST $M_{2b}$ is connected to the data input Din pull down, and the drain is connected to the data output terminal DQout. A resistor R is coupled between the source of the NMOST $M_{2b}$ and the input/output ground reference terminal Vss(i/o).

The source of the NMOST $M_4$ is coupled to the internal ground reference terminals Vss(int), the drain is connected to the gates of the NMOST's $M_{2a}$ and $M_{2b}$, and the gate is coupled to the source of the NMOST $M_{2b}$.

As the data output terminal DQout is brought from a logic 1 to a logic 0, the current to discharge the load capacitor $C_L$ flows through the NMOST's $M_{2a}$ and $M_{2b}$. This current through the resistor R develops a voltage at the gate on of the NMOST $M_4$. The voltage at the gate of the NMOST $M_4$ is the value of the voltage of the input/output ground reference terminal Vss(i/o) plus the current through the NMOST $M_{2b}$ multiplied by the value of the resistor R. If there is an induced voltage on the input/output ground reference terminal Vss(i/o), the voltage level at the gate of the NMOST $M_4$ is shifted to a higher level causing the NMOST $M_4$ to begin to conduct and modify the slew rate of the driver NMOST's $M_{2a}$ and $M_{2b}$ as described for the driver NMOST $M_2$ of FIG. 2. The shifting of the level allows operation of the feedback to adjust the slew rate of the driver NMOST $M_{2a}$ and $M_{2b}$ with greater sensitivity to minimize the induced voltage or ground bounce at the input/output ground reference terminal Vss(i/o).

The value of the resistor R is chosen such that the saturation current of the NMOST's $M_{2b}$ multiplied by the value of the resistor R is on the order of 0.5 volts to 1 volt. In an implementation of this embodiment the resistor could be an NMOST biased to the saturation conducting state.

Figure 4B:
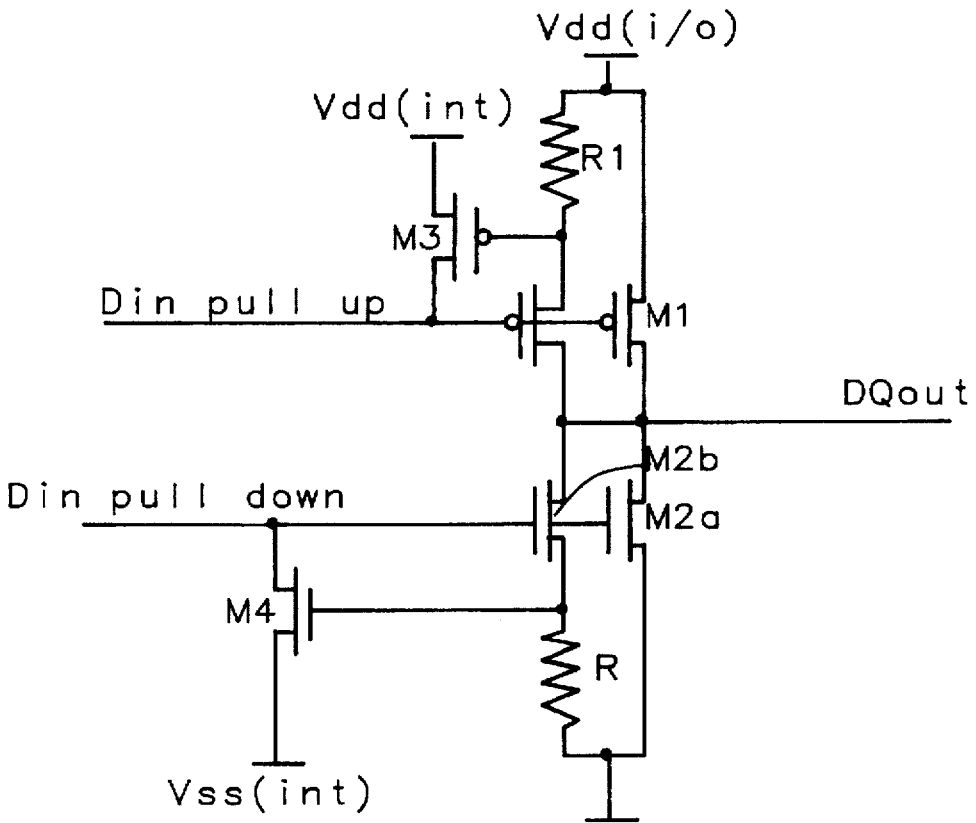

FIG. 4b illustrates the third embodiment wherein the PMOST's $M_{1a}$, PMOST's $M_{1b}$, and PMOST's $M_3$ are connected with resistor $R_1$ as configured as the NMOST's $M_{2a}$, NMOST's $M_{2b}$, NMOST's $M_4$ and resistor R of FIG. 4a. Resistor $R_1$ is connected between the source of the PMOST $M_{1b}$ and the input/output voltage terminal Vdd(i/o). The gate of the PMOST $M_3$ is connected to the source of PMOST $M_{1b}$.

The operation is similar to that described for FIG. 4a. When the PMOST's $M_{1a}$ and $M_{1b}$ begin to conduct and there is an induced noise voltage on the input/output terminal Vdd(i/o), the current through the resistor $R_1$ will develop a voltage sufficient to start the PMOST's $M_3$ to begin to conduct thus controlling the slew rate of the driver PMOST's $M_{1a}$ and $M_{1b}$.

Figure 5:
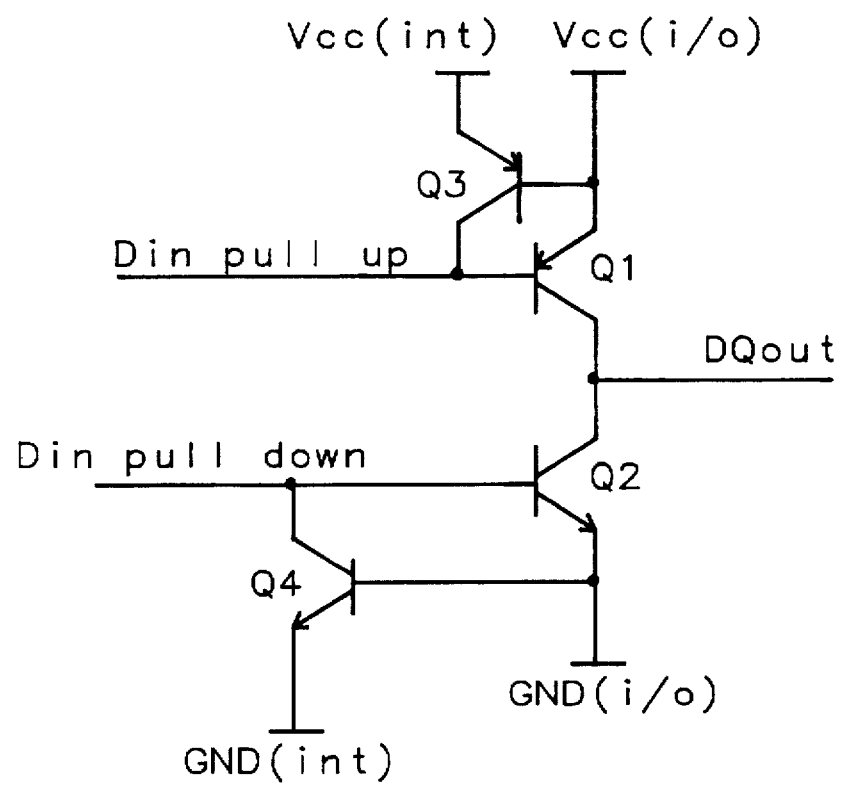
FIG. 5 is a schematic drawing of an off chip driving circuit incorporating the first embodiment of this invention implemented as bipolar transistors.

FIG. 5 is an example of an implementation of the first embodiment using bipolar transistors. The driver PNP transistor $Q_1$ has its collector connected to the output data terminal DQout. The emitter of the driver PNP transistor $Q_1$ is connected to the input/output voltage terminal Vcc(i/o). The base of the driver PNP transistor $Q_1$ is connected to the data input terminal Din pull up. The suppression PNP transistor $Q_3$ has its collector connected to the base of the driver PNP transistor $Q_1$. The emitter of the suppression PNP transistor $Q_3$ is connected to the internal voltage terminals Vcc(int). The base of the p-type suppression transistor $Q_3$ is connected to the emitter of the driver PNP transistor $Q_1$. The driver NPN transistor $Q_2$ has its collector connected to the output data terminal DQout. The emitter of the driver NPN transistor $Q_2$ is connected to the input/output ground reference terminal GND(i/o). The base of the driver NPN transistor $Q_2$ is connected to the data input terminal Din pull down. The suppression NPN transistor $Q_4$ has its collector connected to the base of the driver NPN transistor $Q_2$. The emitter of the suppression NPN transistor $Q_4$ is connected to the internal ground reference terminal Vss(int). The base of the n-type suppression transistor $Q_4$ is connected to the emitter of the driver NPN transistor $Q_2$.

If the data output terminal DQout is a logic 1 and the data inputs Din pull up and Din pull down are brought from a logic 0 to a logic 1, the driver PNP transistor $Q_1$ and driver NPN transistor $Q_2$ start of operate as described for the PMOST $M_1$ and the NMOST $M_2$ in FIG. 1b. However, as the induced voltage at the input/output ground reference terminal GNDs(i/o) starts to increase such that this voltage is greater than the voltage at the internal ground reference terminal GND(int), the suppression NPN transistor $Q_4$ starts to conduct. This lowers the voltage at the gate of the driver NPN transistor $Q_2$ thus starting to turn off the conduction of driver NPN transistor $Q_2$. The lack of current through the input/output ground reference voltage network $X_4$ of FIG. 1a eliminates the induced voltage at the input/output ground reference terminal GND(i/o).

Conversely, if the data output terminal DQout is at a logic 0 and the data inputs Din pull up and Din pull down are brought from a logic 1 to a logic 0, the driver PNP transistor $Q_1$ and driver NPN transistor $Q_2$ start of operate as described for the PMOST $M_1$ and the NMOST $M_2$ in FIG. 1b. The suppression PNP transistor $Q_3$ starts to operate as described above for suppression NPN transistor $Q_4$. The induced voltage at the input/output voltage terminal Vcc(i/o) is now suppressed.

The embodiments have described as implementations of NMOS, PMOS, and bipolar transistors. It should be noted that each embodiment of this invention can be implemented as enhancement/depletion mode devices in either NMOST or PMOST technology or in BiCMOS technology. Additionally the transistors maybe implemented on either silicon substrates or compound semiconductor substrates such as Gallium Arsinide (GaAs).

While this invention has been particularly shown and described with reference to the preferred embodiments thereof, it will be understood by those skilled in the art that various changes in form and details may be made without departing from the spirit and scope of the invention.

What is claimed is:

1. An output driving stage of a plurality of output driving stages arranged upon an integrated circuit substrate to suppress a power distribution transient voltage that results from the switching simultaneously of a number of the plurality of output stages, comprising:

a) a first driver field effect transistor of a first conductivity type, having a gate coupled to a data input pull down terminal, a source coupled to a driver ground distribution network, and drain coupled to a data output terminal;

b) a second driver field effect transistor of a second conductivity type, having a gate coupled to a data input pull up terminal, a source coupled to a driver voltage distribution network and a drain coupled to a the data output terminal;

c) an amplifier means including an input terminal coupled to the driver ground distribution network, a gain circuit to amplify the power distribution transient voltage, and an output terminal having an amplified power distribution transient voltage;

d) a first suppression field effect transistor of the first conductivity type which will begin to conduct if the power distribution transient voltage is present on the driver ground distribution network, wherein said first suppression field effect transistor has a gate coupled to the output terminal of the amplifier means, a source coupled to an internal logic ground distribution network, and a drain coupled to the gate of the first driver field effect transistor; and e) a second suppression field effect transistor of the second conductivity type which will begin to conduct if the power distribution transient voltage is present on the driver voltage distribution network, wherein said second suppression field effect transistor has a gate coupled to the driver voltage distribution network and the source of the second driver field effect transistor, a source coupled to an internal logic voltage distribution network, and a drain coupled to the gate of the second driver field effect transistor.

2. The output driving stage of claim 1 wherein the data output terminal will be switched from a logic 1 to a logic 0, when the data input pull up terminal and the data input pull down terminal are switched from a logic 0 to a logic 1; and will be switched from a logic 0 to a logic 1, when the data input pull up terminal and the data pull down terminal are switched from a logic 1 to a logic 0.

3. The output driving stage of claim 1 wherein the power distribution transient voltage is created as a result of the data output terminal of a plurality of said off chip driving circuits being switched from a logic 1 to a logic 0 and from a logic 0 to a logic 1 with a very large slew rate.

4. The output driving stage of claim 1 wherein the first suppression field effect transistor and the second suppression field effect transistor will decrease the slew rate of said output driver circuit when the power distribution transient voltage is sufficiently large to cause the first and second suppression field effect transistor to conduct.

5. The output driving stage of claim 1 wherein the amplifier means will allow the first suppression field effect transistor to decrease the slew rate of said output driving stage at a lower level of the power distribution transient voltage.

6. An output driver to transfer digital data from an integrated circuit to at least one other integrated circuit chips comprising:

a) a first driver field effect transistor of a first conductivity type having a gate coupled to a data input pull down terminal, a source coupled to a driver ground distribution network, and drain coupled to a data output terminal;

b) a second driver field effect transistor of a second conductivity type having a gate coupled to a data input pull up terminal, a source coupled to a driver voltage distribution network and a drain coupled to a the data output terminal;

c) a third driver field effect transistor having a gate coupled to the data input pull down terminal, a source, and a drain coupled to the data output terminal; and d) a level shifting resistor coupled between the source of the third driver field effect transistor and the driver ground distribution networks e) a transient suppression means to minimize a power distribution voltage transient created by an simultaneous switching of a plurality of said output drivers deposed upon said integrated circuit chip.

7. The output driver of claim 6 wherein the transient suppression means comprises:

a) a first suppression field effect transistor of the first conductivity type which will begin to conduct if the power distribution transient voltage is present on the driver ground distribution network, wherein said first suppression field effect transistor has a gate coupled to the source of the third driver field effect transistor, and the source of the first driver field effect transistor, a source coupled to an internal logic ground distribution network, and a drain coupled to the gate of the first driver field effect transistor; and b) a second suppression field effect transistor of the second conductivity type which will begin to conduct if the power distribution transient voltage is present on the driver voltage distribution network, wherein said second suppression field effect transistor has a gate coupled to the driver voltage distribution network and the source of the second driver field effect transistor, a source coupled to an internal logic voltage distribution network, and a drain coupled to the gate of the second driver field effect transistor.

8. The output driver of claim 6 wherein the data output terminal will be switched from a logic 1 to a logic 0, when the data input pull up terminal and the data input pull down terminal are switched from a logic 0 to a logic 1; and will be switched from a logic 0 to a logic 1, when the data input pull up terminal and the data pull down terminal are switched from a logic 1 to a logic 0.

9. The output driver of claim 6 wherein the power distribution transient voltage is created as a result of the data output terminal of a plurality of said output driver being switched from a logic 1 to a logic 0 and from a logic 0 to a logic 1 with a very large slew rate.

10. The output driver of claim 7 wherein the first suppression field effect transistor and the second suppression field effect transistor will decrease the slew rate of said output driver when the power distribution transient voltage is sufficiently large to cause the first and second suppression field effect transistor to conduct.

11. The output driver of claim 6 wherein the third driver field effect transistor has size that is approximate 10% the size of the first driver field effect transistor.

12. The output driver of claim 6 wherein the level shifting resistor will have a voltage that is shifted to a level higher than the power distribution transient voltage such that the transient suppression means will decrease the slew rate of said output driver at a low level of the power distribution transient voltage.

* * * * *